(12) United States Patent
Sawai et al.

(10) Patent No.: US 11,012,041 B2
(45) Date of Patent: May 18, 2021

(54) DIFFERENTIAL AMPLIFIER CIRCUIT

(71) Applicant: ABLIC Inc., Chiba (JP)

(72) Inventors: Hideyuki Sawai, Chiba (JP); Tsutomu Tomioka, Chiba (JP); Tadakatsu Kuroda, Chiba (JP)

(73) Assignee: ABLIC INC., Chiba (JP)

( * ) Notice: Subject to any disclaimer, the term of this patent is extended or adjusted under 35 U.S.C. 154(b) by 44 days.

(21) Appl. No.: 16/444,610

(22) Filed: Jun. 18, 2019

(65) Prior Publication Data

US 2020/0014348 A1  Jan. 9, 2020

(30) Foreign Application Priority Data

Jul. 3, 2018 (JP) .............................. JP2018-126682

(51) Int. Cl.
*H03F 3/45* (2006.01)

(52) U.S. Cl.
CPC ... *H03F 3/45183* (2013.01); *H03F 2200/375* (2013.01); *H03F 2203/45042* (2013.01); *H03F 2203/45044* (2013.01); *H03F 2203/45354* (2013.01)

(58) Field of Classification Search
CPC .......... H03F 1/02; H03F 3/45; H03F 2200/375
USPC ...................................... 330/9, 253; 327/307
See application file for complete search history.

(56) References Cited

U.S. PATENT DOCUMENTS

| | | | |
|---|---|---|---|
| 2008/0061745 A1 | 3/2008 | Nodo | |
| 2014/0253359 A1* | 9/2014 | Niwa | H03M 1/12 341/172 |
| 2014/0312818 A1* | 10/2014 | Furuchi | H02P 6/14 318/400.29 |

FOREIGN PATENT DOCUMENTS

| | | |
|---|---|---|
| EP | 1128256 A2 | 8/2001 |
| EP | 1717691 A2 | 11/2006 |
| EP | 2128799 A2 | 12/2009 |
| JP | 2000-298566 A | 10/2000 |
| JP | 2008-067188 A | 3/2008 |

OTHER PUBLICATIONS

Extended European Search Report in Europe Application No. 19182678.3, dated Nov. 21, 2019, 6 pages.

* cited by examiner

*Primary Examiner* — Steven J Mottola
(74) *Attorney, Agent, or Firm* — Brinks Gilson & Lione

(57) ABSTRACT

A differential amplifier circuit includes a first input transistor that receives a signal supplied from the first input terminal via a gate thereof, a second input transistor that receives a signal supplied from the second input terminal via a gate thereof, and an offset voltage adjustment circuit that is connected to at least one between the first input terminal and the gate of the first input transistor and between the second input terminal and the gate of the second input transistor.

4 Claims, 4 Drawing Sheets

DIFFERENTIAL AMPLIFIER CIRCUIT

RELATED APPLICATIONS

Priority is claimed on Japanese Patent Application No. 2018-126682, filed on Jul. 3, 2018, the content of which is incorporated herein by reference.

BACKGROUND OF THE INVENTION

1. Field of the Invention

The present invention relates to a differential amplifier circuit.

2. Description of the Related Art

A differential amplifier circuit is a circuit to amplify a difference between signals supplied from two input terminals. If variations occur in input transistors constituting the differential amplifier circuit, an offset voltage occurs in the output signal of the differential amplifier circuit. Japanese Unexamined Patent Application Publication No. 2008-67188 discloses a differential amplifier circuit including an offset voltage adjustment circuit that performs adjustment to make an offset voltage smaller.

FIG. 4 is a circuit diagram illustrating a differential amplifier circuit disclosed in Japanese Unexamined Patent Application Publication No. 2008-67188. The conventional differential amplifier circuit includes input transistors 1 and 2, PMOS transistors 3 and 4, a current source 5, and an offset voltage adjustment circuit 6.

The conventional differential amplifier circuit can make an offset voltage smaller by selectively cutting the fuses of the offset voltage adjustment circuit 6 to adjust resistances between the input transistors 1 and 2 and the current source 5.

However, in the conventional differential amplifier circuit, because the offset voltage adjustment circuit 6 is provided in the current paths of the input transistors, the resistances of the current paths of the input transistors are changed by cutting the fuses and thereby the amplification gain of the differential amplifier circuit is changed.

It is an object of the present invention to provide a differential amplifier circuit that can make the offset voltage of input transistors smaller without affecting an amplification gain.

SUMMARY OF THE INVENTION

One aspect of a differential amplifier circuit in an embodiment according to the present invention includes a first input terminal, a second input terminal, a first input transistor containing a gate to receive a first signal supplied from a first input terminal via the gate thereof, a second input transistor containing a gate to receive a second signal supplied from the second input terminal via the gate thereof, and an offset voltage adjustment circuit connected to at least one between the first input terminal and the gate of the first input transistor and between the second input terminal and the gate of the second input transistor.

According to the differential amplifier circuit of the present invention, because the offset voltage adjustment circuit is connected to at least the one gate of the input transistors and thereby the resistances of the current paths of the input transistors are not changed, the offset voltage of the input transistors can be made smaller without affecting an amplification gain.

DETAILED DESCRIPTION OF THE PREFERRED EMBODIMENTS

Hereinafter, embodiments according to the present invention will be explained in detail with reference to the drawings.

First Embodiment

Figure 1:
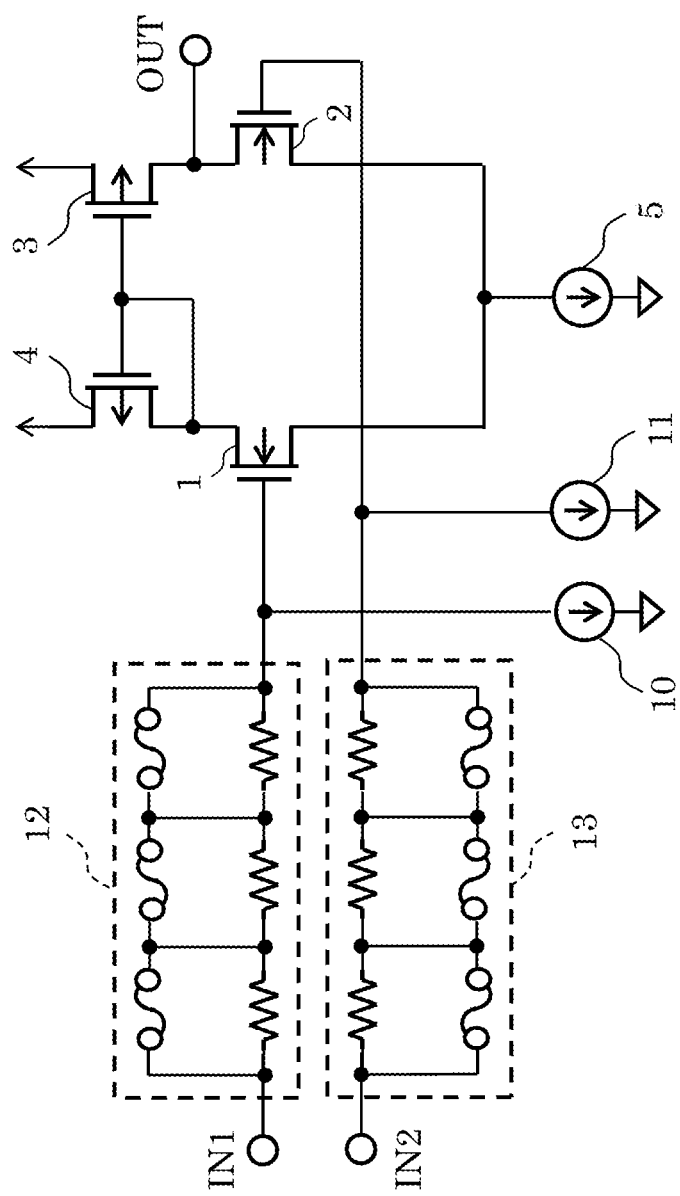
FIG. 1 is a circuit diagram illustrating a differential amplifier circuit according to a first embodiment.

FIG. 1 is a circuit diagram illustrating a differential amplifier circuit according to the first embodiment.

The differential amplifier circuit according to the present embodiment includes input transistors 1 and 2, PMOS transistors 3 and 4, current sources 5, 10, and 11, and variable resistance circuits 12 and 13 each having a resistance circuit and a fuse circuit. The variable resistance circuits 12 and 13 and the current sources 10 and 11 constitute an offset voltage adjustment circuit.

The PMOS transistors 3 and 4 constitute a current mirror circuit and are connected to a power supply terminal VDD (not illustrated) and each drains of the each input transistors 1 and 2. The current source 5 is connected between a GND terminal and each sources of the each input transistors 1 and 2.

The variable resistance circuit 12 is connected between an input terminal IN1 serving as a first input terminal and a gate of the input transistor 1 serving as a first input transistor. The variable resistance circuit 13 is connected between an input terminal IN2 serving as a second input terminal and a gate of the input transistor 2 serving as a second input transistor. The current source 10 serving as a first current source is connected between the gate of the input transistor 1 and the GND terminal. The current source 11 serving as a second current source is connected between the gate of the input transistor 2 and the GND terminal. An output terminal OUT is connected to the drain of the input transistor 2.

The variable resistance circuit 12 adjusts a gate voltage of the input transistor 1 by using a voltage drop obtained by causing the current of the current source 10 to flow into the resistor whose fuse is cut. The variable resistance circuit 13 adjusts a gate voltage of the input transistor 2 by using a voltage drop obtained by causing the current of the current source 11 to flow into the resistor whose fuse is cut. In other words, an adjustment voltage Vadj generated in the offset voltage adjustment circuit is determined by a resistance of the variable resistance circuit 12 (13) and a current value of the current source 10 (11). The adjustment voltage Vadj contains a voltage serving as the first signal applied to the gate of the input transistor 1 and/or a voltage serving as the second signal applied to the gate of the input transistor 2.

Next, an adjustment method of an offset voltage occurred in the differential amplifier circuit of the first embodiment will be explained.

Assuming that a bias voltage V1 is applied to the input terminal IN1 and the voltage of the input terminal IN2 is a voltage V2 when the voltage of the output terminal OUT is decreased by gradually raising the voltage applied to the input terminal IN2 from 0V, a difference between the voltage V1 and the voltage V2 at this time is an offset voltage Vof. For example, the offset voltage can be expressed as Vof=V1−V2.

The fuse of the variable resistance circuit 12 or 13 is appropriately selected and cut to become the adjustment voltage Vadj by which the offset voltage Vof is offset. For example, if the offset voltage Vof is a positive value (V1>V2), the fuse of the variable resistance circuit 12 is cut. On the other hand, if the offset voltage Vof is a negative value (V2>V1), the fuse of the variable resistance circuit 13 is cut.

As described above, in the differential amplifier circuit according to the first embodiment, because the offset voltage adjustment circuit is connected to at least the one gate of the input transistors and thereby the each resistances of the each current paths of the each input transistors is not changed, the offset voltage of the input transistors can be made smaller without affecting an amplification gain.

Second Embodiment

Figure 2:
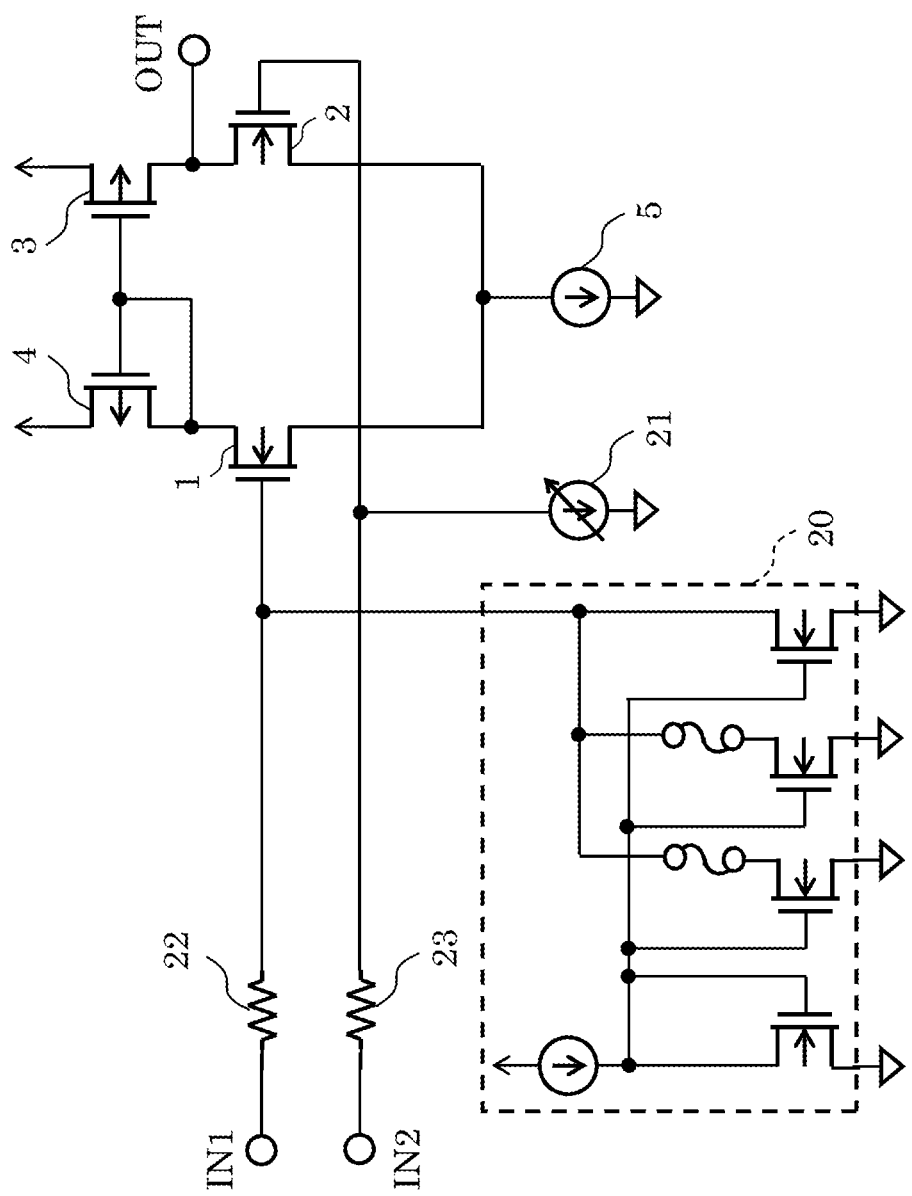
FIG. 2 is a circuit diagram illustrating a differential amplifier circuit according to a second embodiment.

Next, a differential amplifier circuit according to the second embodiment will be explained with reference to FIG. 2.

The differential amplifier circuit according to the second embodiment includes, as an offset voltage adjustment circuit, resistors 22 and 23 instead of the variable resistance circuits 12 and 13 and variable current sources 20 and 21 instead of the current sources 10 and 11.

Because the other configuration is similar to that of the first embodiment, the same components have the same reference numbers and their explanations are appropriately omitted.

The resistor 22 serving as a first resistor is connected between the input terminal IN1 and the gate of the input transistor 1. The resistor 23 serving as a second resistor is connected between the input terminal IN2 and the gate of the input transistor 2. The variable current source 20 serving as a first variable current source is connected between the gate of the input transistor 1 and the GND terminal. The variable current source 21 serving as a second variable current source is connected between the gate of the input transistor 2 and the GND terminal.

Each of the variable current sources 20 and 21 includes a current source, NMOS transistors constituting a current mirror circuit, and fuses. The variable current source 20 is configured to adjust an amount of current by cutting any fuse connected to the NMOS transistors constituting the current mirror circuit. The variable current source 21 is also configured as the variable current source 20.

The resistor 22 adjusts the gate voltage of the input transistor 1 by inducing a voltage drop by the inflow of the current of the variable current source 20. The resistor 23 adjusts the gate voltage of the input transistor 2 by inducing a voltage drop by the inflow of the current of the variable current source 21. In other words, the adjustment voltage Vadj is determined by the resistance of the resistor 22 (23) and the current value of the variable current source 20 (21). The adjustment voltage Vadj contains a voltage serving as the first signal applied to the gate of the input transistor 1 and/or a voltage serving as the second signal applied to the gate of the input transistor 2.

Next, the adjustment method of the offset voltage of the differential amplifier circuit according to the present embodiment will be explained.

The fuse of the variable current source 20 or 21 is appropriately selected and cut to become the adjustment voltage Vadj by which the offset voltage Vof is offset. For example, if the offset voltage Vof is a positive value (V1>V2), the fuse of the variable current source 21 is cut. On the other hand, if the offset voltage Vof is a negative value (V2>V1), the fuse of the variable current source 20 is cut.

As described above, in the differential amplifier circuit according to the second embodiment, because the offset voltage adjustment circuit is connected to at least the one gate of the input transistors and thereby the each resistances of the each current paths of the each input transistors is not changed, the offset voltage of the input transistors can be made smaller without affecting an amplification gain.

Next, another example of the differential amplifier circuit in the second embodiment will be explained with reference to FIG. 3.

Figure 3:
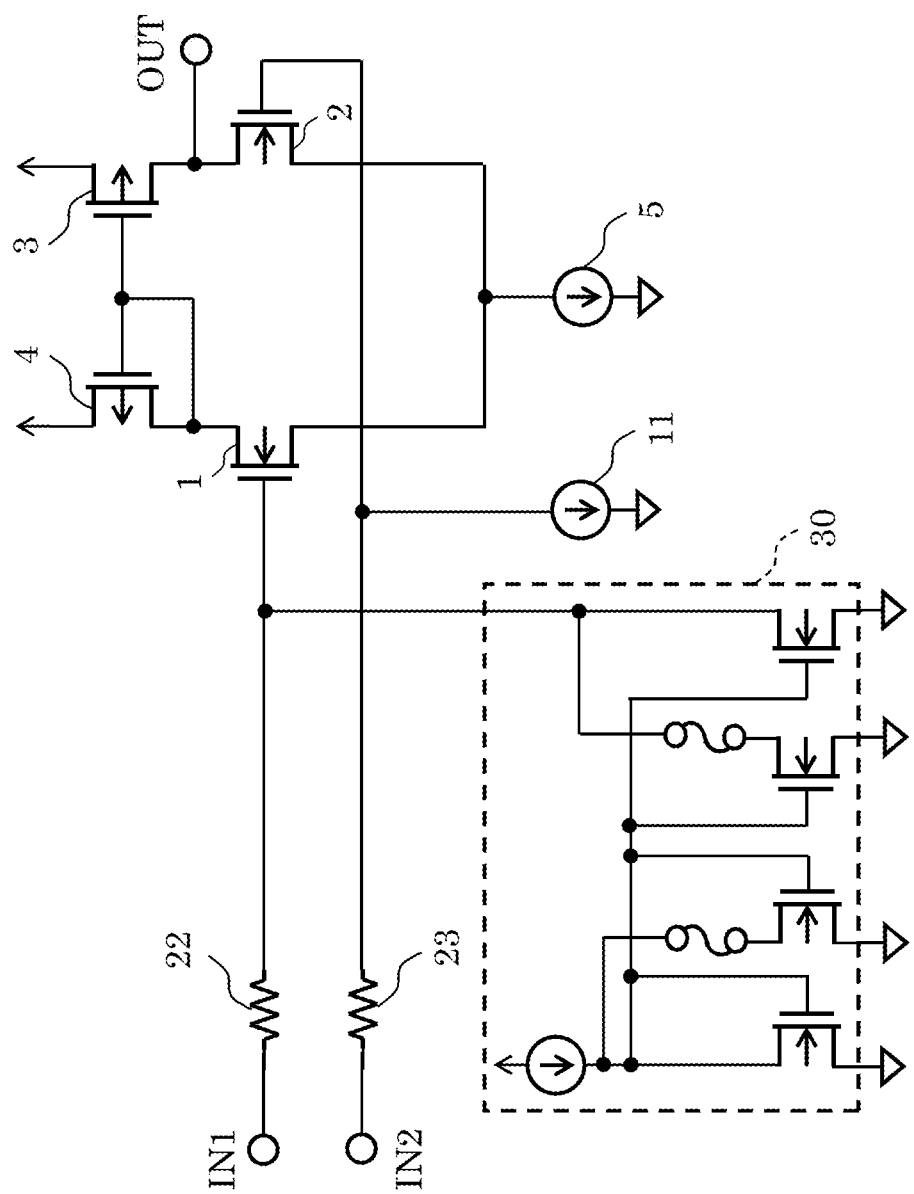
FIG. 3 is a circuit diagram illustrating another example of the differential amplifier circuit according to the second embodiment.
Figure 4:
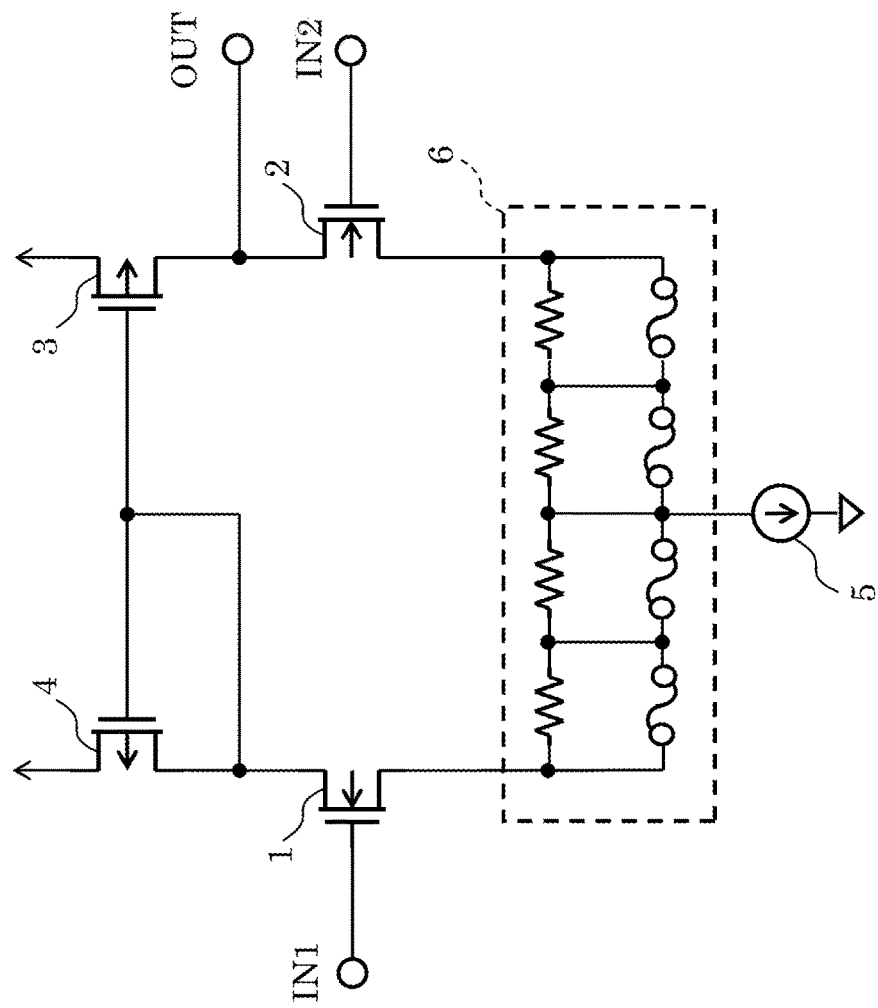
FIG. 4 is a circuit diagram illustrating a conventional differential amplifier circuit.

The differential amplifier circuit illustrated in FIG. 3 includes, as an offset voltage adjustment circuit, a variable current source 30 instead of the variable current source 20 and the current source 11 instead of the variable current source 21. Regarding the other configuration, the same components have the same reference numbers and their explanations are appropriately omitted.

While the variable current sources 20 and 21 have the configuration that a current is decreased by cutting any fuse, the variable current source 30 has a configuration that a current can be increased and decreased by cutting any fuse. If the variable current source 30 having such the configuration is included instead of the variable current source 20, it is also possible to obtain the same effect as that of the differential amplifier circuit in FIG. 2.

As described above, the embodiments according to the present invention have been explained. However, the present invention is not limited to the differential amplifier circuits of the above embodiments, and various modifications can be made without departing from the spirit of the present invention.

For example, the variable resistance circuits 12 and 13 may have the number of resistances and the number of fuses that are appropriately set and may employ switches instead of fuses. Moreover, the variable current sources 20, 21, and 30 may have the number of NMOS transistors and the number of fuses that are appropriately set and may employ switches instead of fuses. That is, the offset voltage adjustment circuits described above may be connected to at least one between the input terminal IN1 and the gate of the input transistor 1 and between the input terminal IN2 and the gate of the input transistor 2.

Moreover, the differential amplifier circuits explained in the embodiments are not limited to the above circuit configurations. For example, the input transistors may be composed of PMOS transistors. Further, in the differential amplifier circuits described above, the current source 11 may include a current source having the same configuration as that of the variable current source 30.

In addition, because each of the current sources is connected to each of the gates of the input transistors 1 and 2, the differential amplifier circuits in the embodiments according to the present invention also have an advantage being capable of suppressing an undefined state in which each of the electric potentials in each of the input terminals is unstable due to the current sources in a case where an open fault occurs in the input terminals IN1 and IN2.

What is claimed is:

1. A differential amplifier circuit comprising:
   a first input terminal;
   a second input terminal;
   a first input transistor containing a gate to receive a first signal supplied from the first input terminal via the gate thereof;
   a second input transistor containing a gate to receive a second signal supplied from the second input terminal via the gate thereof; and
   an offset voltage adjustment circuit connected to at least one of between the first input terminal and the gate of the first input transistor and between the second input terminal and the gate of the second input transistor, the offset voltage adjustment circuit adjusting an offset voltage of the input transistors depending on a generated adjustment voltage,
   wherein the offset voltage adjustment circuit includes a first variable resistance circuit containing a plurality of resistances serially connected between the first input terminal and the gate of the first input transistor, and a first current source connected to a connection point between the first variable resistance circuit and the gate of the first input transistor, and
   wherein the first current source is configured to supply a current to flow into the first variable resistance circuit and to generate the adjustment voltage.

2. The differential amplifier circuit according to claim 1, wherein the offset voltage adjustment circuit includes a second variable resistance circuit containing a plurality of resistances serially connected between the second input terminal and the gate of the second input transistor, and a second current source connected to a connection point between the second variable resistance circuit and the gate of the second input transistor, and
   wherein the second current source is configured to supply a current to flow into the second variable resistance circuit and to generate the adjustment voltage.

3. A differential amplifier circuit comprising:
   a first input terminal;
   a second input terminal;
   a first input transistor containing a gate to receive a first signal supplied from the first input terminal via the gate thereof;
   a second input transistor containing a gate to receive a second signal supplied from the second input terminal via the gate thereof; and
   an offset voltage adjustment circuit connected to at least one of between the first input terminal and the gate of the first input transistor and between the second input terminal and the gate of the second input transistor, the offset voltage adjustment circuit adjusting an offset voltage of the input transistors depending on a generated adjustment voltage,
   wherein the offset voltage adjustment circuit includes a first resistance connected between the first input terminal and the gate of the first input transistor and a first variable current source connected between the first resistance and the gate of the first input transistor, and
   wherein the first variable current source is configured to supply a current to flow into the first resistance and to generate the adjustment voltage.

4. The differential amplifier circuit according to claim 3, wherein the offset voltage adjustment circuit includes a second resistance connected between the second input terminal and the gate of the second input transistor and a second variable current source connected between the second resistance and the gate of the second input transistor, and
   wherein the second variable current source is configured to supply a current to flow into the second resistance and to generate the adjustment voltage.

* * * * *